United States Patent [19]

Chan et al.

[11] Patent Number: 5,359,722
[45] Date of Patent: Oct. 25, 1994

[54] METHOD FOR SHORTENING MEMORY FETCH TIME RELATIVE TO MEMORY STORE TIME AND CONTROLLING RECOVERY IN A DRAM

[75] Inventors: Shiu K. Chan, Poughkeepsie; Joseph H. Datres, Jr., Wappingers Falls; Tin-Chee Lo, Fishkill, all of N.Y.

[73] Assignee: International Business Machines Corporation, Armonk, N.Y.

[21] Appl. No.: 555,960

[22] Filed: Jul. 23, 1990

[51] Int. Cl.$^5$ .................... G06F 12/00; G06F 1/04
[52] U.S. Cl. .................... 395/425; 395/550; 364/DIG. 2; 365/233; 365/203
[58] Field of Search .......... 395/425, 550; 365/233, 365/203; 371/40.1, 40.2

[56] References Cited

U.S. PATENT DOCUMENTS

| | | | |
|---|---|---|---|
| 3,740,723 | 6/1973 | Beausoleil et al. | 395/425 |
| 4,491,910 | 1/1985 | Caudel et al. | 395/800 |
| 4,586,131 | 4/1986 | Caudel et al. | 395/775 |
| 4,641,276 | 2/1987 | Duuki-Jacobs | 395/325 |
| 4,667,313 | 5/1987 | Pinkham et al. | 365/240 |
| 4,731,758 | 3/1988 | Lam et al. | 365/189.05 |
| 4,860,192 | 8/1989 | Sachs et al. | 395/400 |
| 5,019,965 | 5/1991 | Webb, Jr. et al. | 395/550 |
| 5,031,141 | 7/1991 | Guddat et al. | 365/233 |
| 5,047,920 | 9/1991 | Funabashi | 395/425 |
| 5,058,116 | 10/1991 | Chao et al. | 371/40.2 |

OTHER PUBLICATIONS

Kalter et al., "An Experimental 80 ns 1 MBit DRAM with Fast Page Operation," IEEE Journal of Solid State Circuits, vol. SC-20, No. 5, Oct. 1985, pp. 914-923.

Aichelmann, Jr. et al., "Hierarchy Memory for Improved Processor Performance", IBM Tech. Disc. Bull., vol. 19, No. 8, Jan. 1977, pp. 3071-3073.

Tong, "Memory Transfer at Arbitrary Byte Boundaries," IBM Tech. Disc. Bull., vol. 26, No. 12, May 1984, pp. 6473-6475.

*Primary Examiner*—Glenn Gossage
*Attorney, Agent, or Firm*—Bernard M. Goldman

[57] ABSTRACT

A method for reducing fetch time in a computer system provides a memory fetch cycle that is shorter than the memory store cycle. Each chip of the computer system has at least one dynamic random access memory array (DRAM) and a small high speed cache static random access memory (SRAM) on the chip. The system memory controller recognizes the fetch or store state of a memory request in generating a DRAM subrow-address timing signal (RAS) and a cache address timing signal (CAS) for enabling the accessing and addressing of bits in the SRAM and recovery in the DRAM. The RAS starts DRAM recovery for a fetch cycle at or near the start of fetching of data from the SRAMs on the chips, but controls RAS to not start DRAM recovery for a store cycle until SRAM data storing is done. The clocks on the chips contain circuits that control DRAM recovery while fetching during DRAM data from the SRAMs, but that prevent DRAM recovery from starting until data storing in the SRAMs is complete.

13 Claims, 8 Drawing Sheets

METHOD FOR SHORTENING MEMORY FETCH TIME RELATIVE TO MEMORY STORE TIME AND CONTROLLING RECOVERY IN A DRAM

Embodiments of the invention improve the operation of semiconductor memory chips by shortening their memory fetch times and requiring different memory operation times for fetch and store operations, to enable a computer memory made of the chips to have a faster memory access time. Embodiments of the invention modify the internal timing control circuits and affects the number of I/O (input/output) pins for semiconductor memory chips to significantly increase memory utilization for memory fetch operations.

BACKGROUND

Conventional computer systems have long had a processing unit having registers and logic circuits external to the computer memory, with the processing unit causing the fetching and storing of data in the memory. The processor often fetches data from memory, changes the data, and stores the changed data into the memory, which may be to the same or to a different memory location than the location from which the data was originally accessed. A memory bus and control unit transfer the data between the processor and the memory when fetching and storing the data. Input/output pins on each memory chip connect it to a circuit board which provides connections for transferring address, data and control bits to the I/O pins on the chips. The number of I/O pins on each chip is limited, thereby limiting the number of signals that can be simultaneously transferred between the chip and circuits external to the chip.

Most conventional computer memories are currently made of dynamic random access memory (DRAM) semiconductor chips. Conventional memories are extendable by adding DRAM chips, up to the chip capacity of the circuit board(s). Static random access memory (SRAM) chips are also available for use in memories, but SRAM chips store less memory bits, have faster access time, use more power, and are more costly. Conventional memories often have addressability-control switches which have their settings changed when chips are added or removed for changing the size of the memory.

The semiconductor chips found in conventional computer memories use equal time periods for both fetch (read) and stork (write) operations. Some current memory chips internally contain an interlock circuit that requires the same clocking time periods for both fetch and store operations within the chips.

Conventional memories have used chips in which each chip contains a large-capacity DRAM requiring refreshing to maintain stored data and a small-capacity buffer register, or cache, to speed up external data communications with the chip.

Prior semiconductor memory chips have contained DRAM and SRAM arrays in which the SRAM provide a high speed interface between the slower DRAM arrays and faster data buffers external of the chip.

U.S. Pat. No. 3,740,723 to Beausoleil et al entitled "Integral Hierarchical Binary Storage Element" discloses memory chips using two-dimensional addressing which may have a shift register at the intersections of the two-dimensional address selections. This patent discloses an on-chip cache in a memory chip.

An article published in the IEEE Journal of Solid-State Circuits, Volume SC-20, No. 5, October 1985, pages 914–923 by H. L. Kalter et al discloses a DRAM/SRAM arrangement for reducing the access time for both memory fetches and stores which is an element used by the embodiments of the subject invention. The technique disclosed in this article can be used independently of the subject invention in the same memory to perform its speedup function.

An article in the IBM Technical Disclosure Bulletin, Vol. 19, No. 8, January 1977 at page 3071 by F. J. Aichelmann, Jr. and N. M. DiPilato entitled "Hierarchy Memory for Improved Microprocessor Performance" discloses a page store chip hierarchy.

An article in the IBM Technical Disclosure Bulletin, Vol. 26, No. 12, May 1984 at page 6473 by R. C. Tong entitled "Memory Transfer at Arbitrary Byte Boundaries" discloses the use of one or two shift registers external to the chips comprising a memory, for which the shift registers performed the processor function of reordering the bit sequence in a byte location in the memory, by transferring the byte on a bus from the memory to the register, reordering the bits in the byte, and writing the reordered byte back into the memory.

U.S. Pat. No. 4,491,910 to Caudel et al entitled "Microcomputer Having Data Shift Within Memory", and U.S. Pat. No. 4,586,131 to Caudel et al entitled "Microcomputer Having Data Move Circuits For Within-Memory shift of Data Words" have the same specification. They disclose the subject matter of the following claim limitation: "shift means moving an entire data word in the memory from one location to another location having an adjacent address".

U.S. Pat. No. 4,641,276 to Dunki-Jacobs discloses a data communication method and means for transferring data in parallel to a source register, serially shifting the data from the source register to a destination register, and then transferring the data in parallel to another functional unit.

U.S. Pat. No. 4,667,313 to Pinkham et al discloses the use of a shift register to access a row of bits obtained from a memory bus to be serially accessed at a tapped position in the shift register.

U.S. Pat. No. 4,731,758 to Lam et al discloses separate arrays on the same chip connected through a transfer gate.

U.S. patent application serial number 479,145; filed Feb. 13, 1990 by J. E. Barth et al entitled "Dynamic RAM with On-Chip ECC and Optimized Bit and Word Redundancy" discloses on-chip redundancy with scattered groupings. That application is assigned to the same assignee as the subject application.

None of the above cited prior art suggests the invention claimed in the subject application.

SUMMARY OF THE INVENTION

The embodiments of the invention speed up computer memory system operations by providing a memory fetch cycle that is shorter than the memory store cycle. To do this, the embodiments of the invention changes the timing of the recovery part of the fetch operation in semiconductor memory chips comprising the system memory. Each chip has at least one dynamic random access memory array (DRAM) and a small high speed memory (SRAM cache) on the chip. The embodiments of the invention overlap the DRAM recovery part of a fetch cycle with the fetching of data from the caches on chips, and recognizes that this overlap cannot be done for a store cycle (which remains conventional).

It is an object of this invention to increase the speed of fetch accesses in a semiconductor DRAM/cache type of memory chip.

It is a further object of this invention to speed up the performance of a computer memory system by shortening the time period for fetching data in semiconductor chip of the computer memory system.

It is another object of this invention to modify the internal structure of each semiconductor chip to improve its fetch performance in a computer system memory.

It is still another object of this invention to reduce the time for each fetch operation in a computer memory system by overlapping the readout of data from a cache on a memory semiconductor chip and its DRAM recovery processing for the same fetch operation.

It is another object of this invention to speed-up memory operation by reducing or eliminating a bus transfer gap of one or more machine cycles in which no data is transferred during the gap, which occurs between the last data transfer for a memory fetch request and the first data transfer of a next following fetch/store memory request, in addition to reducing the time for each fetch operation by having the DRAM recovery occur during the cache readout.

It is a still further object of this invention to reduce or eliminate a gap of one or more machine cycles during which no data is transferred between the last data outputted for a fetch request and the first data output/input for a next following fetch/store operation for a semiconductor chip having a predetermined number of I/O pins for receiving row and column subsets of address bits provided by a predetermined multiplexing method for the selection of data bits stored in the chip.

DESCRIPTION OF THE DETAILED EMBODIMENT

On-chip Cache:

The embodiments of the subject invention require a "cache" internal to each memory chip. An on-chip cache is a data buffer that buffers data being transferred between a DRAM (located on the chip with the cache) and a memory system buffer located external to the chip. (The on-chip cache differs from processor caches in that the on-chip cache does not have a directory, as does a processor cache.)

The external memory system buffer receives data bits from, and sends data bit(s) to, I/O pins on the chip that transfer the data bit(s) to the on-chip cache. Data bit(s) are located in the on-chip cache by an address supplied from a source external to the chip, i.e. memory controller (MC), such as address bits C0–C6, which are described herein as being clocked by a "column address strobe" (CAS) signal generated and sent from the MC to the chip in the manner shown in FIG. 7.

The form of on-chip cache used in the preferred embodiments herein is the SRAM (static random access memory) which represents a register of Latches that store the state of received data bits without the need for being refreshed, as in a DRAM.

"External accessing" is a term used herein to describe the process of transferring data bits between an on-chip cache and an external source (the memory system buffer) in either direction. The on-chip cache permits embodiments of this invention to perform accessing external to a DRAM at the same time the DRAM is recovering.

"Overlapping" is a term used herein to describe the simultaneous performance of the external accessing and part or all of the DRAM recovery. To obtain the overlap, the preferred embodiments advance the time for starting the DRAM recovery during a fetch operation in a chip, so that at least part of the DRAM recovery occurs at the same time that external accessing of data is being done in the on-chip cache.

Figure 1:
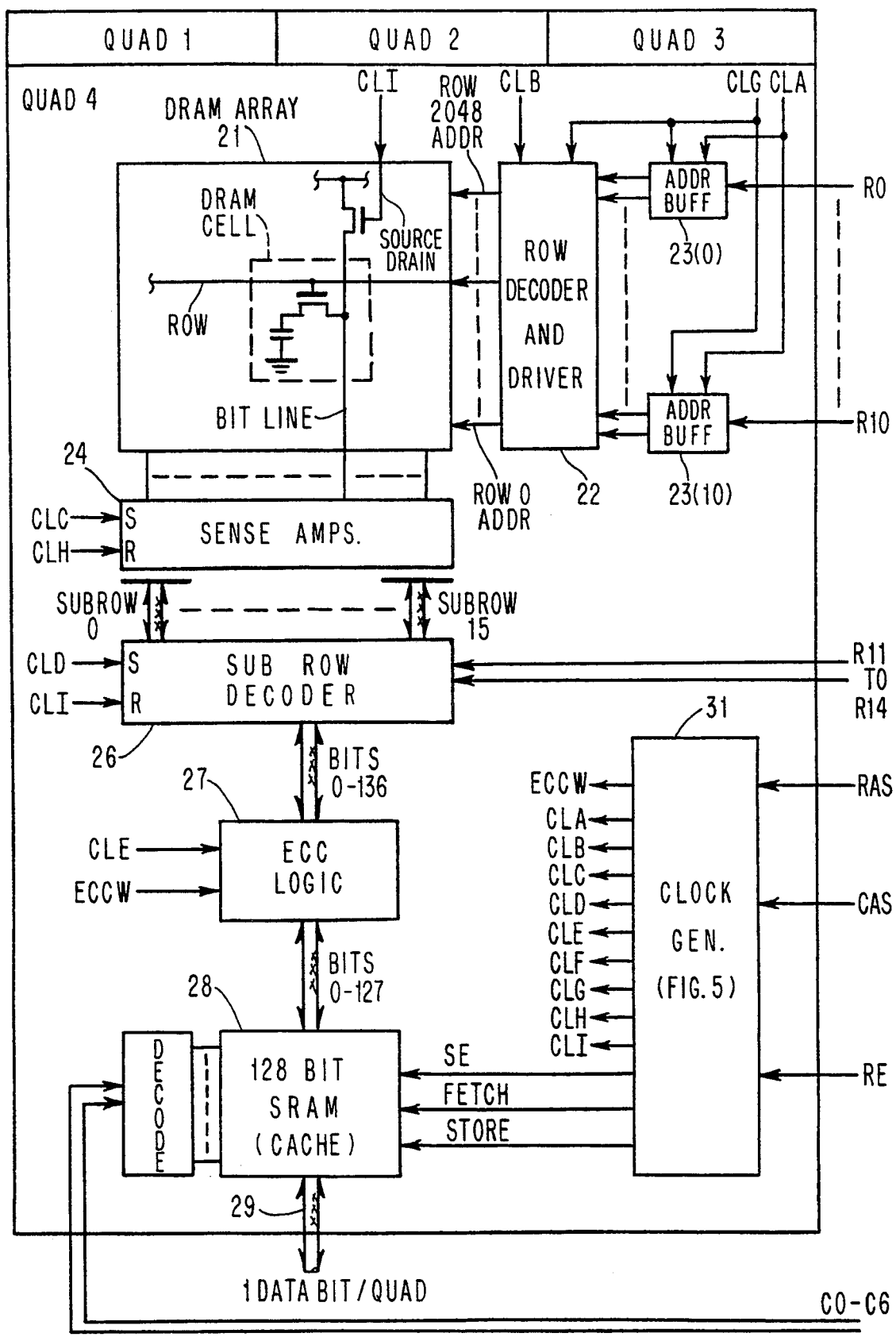
FIG. 1 represents circuits on a semiconductor chip designed with four identical quadrants which receive the same address and clock signals and output/input four data bits in parallel, one data bit per chip quadrant. Each quadrant has a DRAM for refreshable storage and a SRAM for providing the data input/output for the chip.

Chip Structure in the Preferred Embodiments:

FIG. 1 represents a 16 Mega-bit (Mb) semiconductor memory chip used by a preferred embodiment of this invention described herein. Each chip has four identically constructed quadrants. Each quadrant has a 4 Mb dynamic random access memory (DRAM) circuit array, an error correction circuit (ECC), and a small high speed Static RAM (SRAM) that may for example have a 128 bit size. The total storage capacity of the chip in all quadrants is 16 Mb, which is the storage provided by its four DRAM arrays. Any single access to the chip accesses four data bits in parallel, one bit being accessed in each of the four quadrants.

A 22 bit address is provided to the chip, which is received by I/O pins on the chip. The address signals are distributed within the chip to each of its quadrants.

The 22 address bits comprise row address bits R0–R10 that select a row in each DRAM and R11–R14 that select a subrow in the row, and column address bits C0–C6 for selecting a data bit in the selected subrow. The 22 address bit signals are time-multiplexed to 18 pins on the chip as shown by the "DRAM address" and "SRAM address" in FIG. 3 (discussed later).

A DRAM row in each quadrant has 2192 bits. A row is divided into sixteen equal subrows of 137 bits. Each row includes 2048 data bits and 144 check bits distributed equally among the 16 subrows to support error detection and correction for each subrow. Hence, each subrow comprises 128 data bits and 9 check bits (137 bits), which are sent to an ECC circuit to generate an error free set of the 128 data bits without any check bits. (This ECC operation allows imperfect DRAMs to operate as if they are perfect). Then the 128 error free bits of the subrow are loaded into the respective quadrant's SRAM. This DRAM-to-SRAM subrow accessing operation occurs in the same way for either a fetch or a store operation of the chip.

Details in Each Quadrant of a Chip:

FIG. 1 also shows clocking inputs for each quadrant in the chip structure and shows its clocking connections for controlling the operation of a preferred embodiment of the invention. Each processor fetch or store request sent to the memory system generates a memory address in a memory controller (not shown), in which the first address bits provided to the chip are row address bits R0–R10 that are sent to 11 pins on each chip and are latched into respective address buffers (AB) 23(0)–23(10) that store the received row address for the remainder of the respective memory access. Row decoders and drivers 22 receive the stored address bits R0–R10 from address buffers 23(0)–23(10) under clock control and generate a DRAM row address that selects a row of 2192 bits in the DRAM in each quadrant of the chip.

The selected row of 2192 bits is outputted to sense amplifiers 24 under clock control. Sense amplifiers 24 then output the selected row to a subrow decoder 26. Address bits R11–R14 are received at other pins on the chip immediately after the row selection bits are received. Address bits R11–R14 are latched in subrow decoder 26 under clock control and are stored for the remainder of the current access. Decoder 26 uses bits R11–R14 to address and select a 1/16th part of the row as the subrow required by the current memory request. Subrow decoder 26 outputs the selected subrow to an ECC circuit 27 under clock control. ECC circuit 27 interprets data and check bits included in the subrow's 137 bits (which comprise 128 data bits and 9 check bits) according to a predetermined error correcting code, such as the well known Hamming code to generate 128 error free data bits that are outputted to SRAM 28 under clock control. SRAM 28 stores the received 128 data bits (without any check bits) for selection and outputting or inputting under control of external signals received from the memory controller. These externally provided SRAM signals are received as a sequence of eight addressing signals (C0–C6)1 through (C0–C6)8 in the preferred embodiment, in which each signal (C0–C6) is a combination of seven addressing bits that locates any one of the 128 data bits in the SRAM.

The SRAM bit located by each received combination of address bits C0–C6 selects one data bit, which for a fetch operation is outputted from the SRAM as output data, or for a store operation is stored into the SRAM as input data, for each quadrant in the chip. Thus, four data bits are outputted or inputted in parallel by the four SRAMS for the four quadrants of the chip.

A clock generator 31 provides timing signals to the circuits in each quadrant of the chip for controlling the movement of data within the quadrant for each fetch/store (read/write) operation of the chip. Generator 31 generates two phases of clock signals, including a DRAM access phase followed by a DRAM recovery phase. The access phase obtains a subrow of data from the DRAM and loads it into the SRAM 28. The recovery phase writes the 128 data bit SRAM content (including any changed data bits of a store operation) back into the currently selected subrow in the DRAM to restore the row for its subsequent use. (The clock generator 31 may have multiple copies in different physical locations on the chip. Each multiple clock generator operates the same way in parallel in the manner of the clock generator 31 described herein.)

The memory controller provides a set of signals to pins on each chip for controlling each clock generator 31, including signals such as RAS, CAS and RE control signals. The RAS signal controls the clock timing for latching the R0–R10 and R11–R14 addresses, while the CAS signal controls the clock timing for latching the eight C0–C6 addresses. The high/low level state of the RAS signal determines which of the two operating phases is currently being provided by clock generator 31.

The received state of signal RE determines whether the current clock outputs will control a fetch or a store operation for the chip. If the level of signal RE is high (1), it indicates a fetch operation; and if signal RE is low (0), it indicates a store operation by the chip. The clock signals start the DRAM recovery phase differently when the RE signal indicates a fetch state than when RE indicates a store state.

During the DRAM access phase, generator 31 outputs in sequence the clock signals CLA, CLB, CLC, CLD, CLE and SE. Signals CLA–CLE are each a pulse signal generated from the falling transition of the delayed RAS signal. CLA clocks the address buffers 23 to store the received row address signals R0–R10. CLB clocks row decoders and drivers 22 to use bits R0–R10 to select and transfer a 2192 bit row in the DRAM to its sense amplifiers 24, which amplify and provide the 2192 bits in sixteen subrows to a subrow decoder 26. CLD clocks sub-row decoder 26 to select a subrow and provide it to ECC logic circuits 27. CLE clocks the error correction operation of circuits 27. Signal SE enables the SRAM to load the 128 error free data bits of the subrow from the ECC logic 27, and to be externally clocked by the eight sequential signals C0–C6 from the memory controller for sequentially accessing eight of its 128 data bits at any locations in the SRAM.

The start of the DRAM recovery phase is determined differently by this embodiment for fetch operations than for store operations. During the DRAM recovery phase, generator 31 outputs clock signals CLF, CLG, CLH, CLI and ECCW in sequence, each being a pulse generated from the falling transition of the delayed RAS signal waveform. Signal CLF clocks the signal ECCW to activate the ECC logic circuits 27 in FIG. 1 to read the current 128 data bit SRAM content into the ECC circuit for generating nine check bits therefrom as a 137 bit subrow. Subrow decoder 26 (which has latched the last received address bits R11–R14) is then activated by clock signal CLI to merge this 137 bit subrow into the currently addressed 1/16th part of the row and then reset the R11–R14 latched state. CLH clocks the updated row from decoders 26 to sense amplifiers 24 which store it into the DRAM row currently activated by the select line from row decoder 22 (that are still being activated by the stored row address bites R0–R10 latched in address buffers 23(1)–23(10)).

In a fetch operation, the storing of the updated row from the sense amplifier back into the selected DRAM row will refresh it. In a store operation, the storing of the updated row into the DRAM selected row includes all new bits stored into the SRAM for the store operation, and also refreshes the entire row. The chip operation is now completed for either a fetch operation or a store operation.

Figure 2:
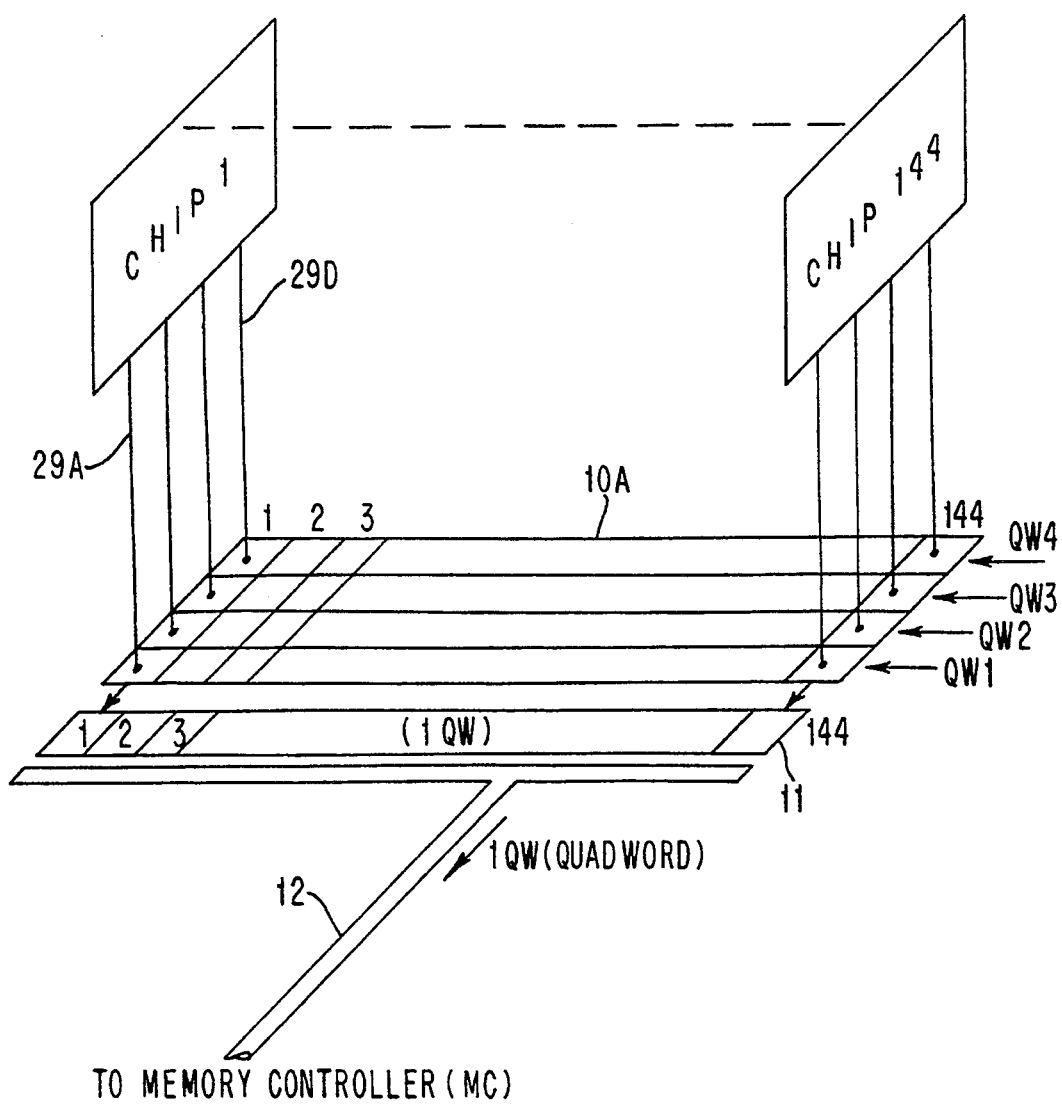
FIG. 2 illustrates a memory system comprised of 144 chips using a single data buffer.

Memory System Structure:

FIG. 2 shows a memory system that contains 144 chips having the previously described structure. The memory system includes one or more memory cards having 144 chips and a data buffer 10A that contains four sub-buffers. The data buffer 10A is connected to a data register 11 that is connected to a memory bus 12. Bus 12 connects to a memory controller (MC).

The four SRAMS in each chip are respectively connected to four pins on the chip for transferring data bits in parallel between external data lines 29A-29D and the four SRAMs. The four I/O lines of each of the 144 chips in the memory system connect to the four sub-buffers at the same corresponding bit location from the left end of each of the four sub-buffers.

In a single machine cycle, a bit being addressed by a signal C0-C6 in every SRAM of all 144 chips is transferred to the four sub-buffers from the SRAMs for a fetch operation, or from the four sub-buffers to the SRAMs for a store operation. This loads/unloads 4 quadwords (QWs) in buffer 10A in one machine cycle. The 144 bits (including 16 check bits not to be confused with the unrelated 9 check bits stored in each DRAM subrow for generating the SRAM data) in each sub-buffer comprise four 32 bit data words, which is one QW in each sub-buffer. These 16 check bits are used by ECC circuits in the memory controller MC.

This memory system may contain any integral multiple of the 144 chips, in which each set of 144 chips can comprise a memory sub-system that transfers its data bits (in the manner described for the memory system represented in FIG. 2) to/from the data buffer 10A.

Thus for a processor memory fetch request for transferring a data line containing a multiple of 4 QWs, the SRAMs (in all of the 144 chips of a memory group) output 4 QWs in parallel into the data fetch buffer in one machine cycle. In the next cycle, the first QW (in the first sub-buffer of the 4 QWs in buffer 10A) is transferred as 144 bits in parallel through a data register 11 and through bus 12 to the memory controller. On the next machine cycle, the second QW in buffer 10A is transferred to the memory controller, and so on, so that in four CPU machine cycles all 4 QWs in all sub-buffers are transferred through register 11 and bus 12 to the memory controller.

Figure 4:
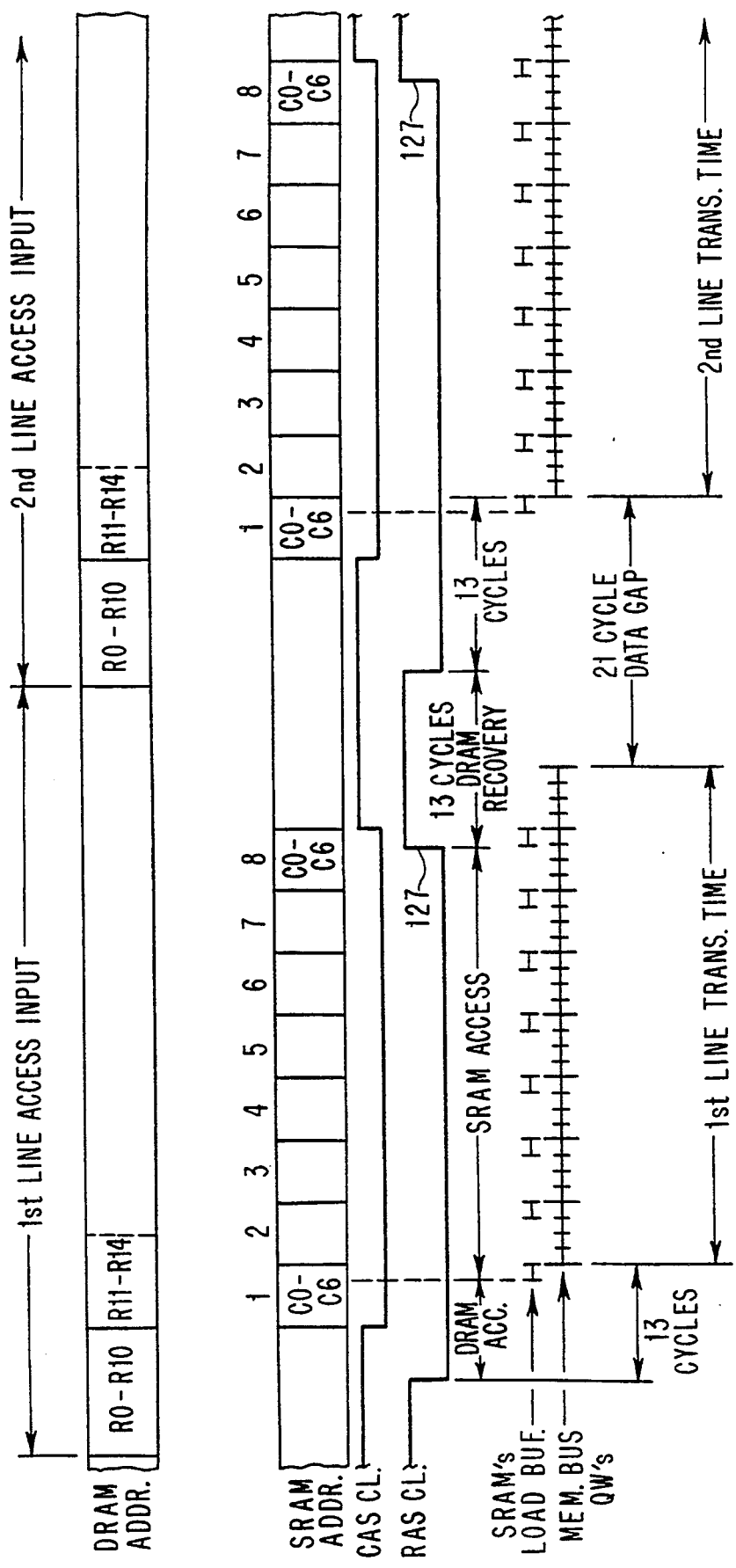
FIG. 4 illustrates waveforms of memory control signals for line fetch operations exemplary of the prior art requiring a large data gap on the system bus between consecutive line fetch operations.

Prior art FIG. 4 shows the timing of when data buffer 10A is filled in one machine cycle with 4 QWs, and when data buffer 10A unloads one QW to the memory controller in each of the next four machine cycles, which is repeated for each of the eight C0-C6 signals for a memory line fetch operation. The second (and each following) loading of data buffer 10A from the chips occurs after, but in the same machine cycle, which outputs to bus 12 the last QW of the prior loading of data buffer 10A for the line fetch through buffer register 11.

In the preferred embodiment, the memory system operates to transfer 8 buffer loads per memory line fetch or line store. But a line fetch and store can have any predetermined number of buffer loads, since the number of buffer loads is chosen to provide the number of QWs comprising a "line of data" in the memory system. Thus for the memory system to provide each line of data with 32 QWs per line, 8 buffer loads are transferred to provide a total of $8 \times 4$ QWs = 32 QWs per memory line fetch or store.

Figure 6:
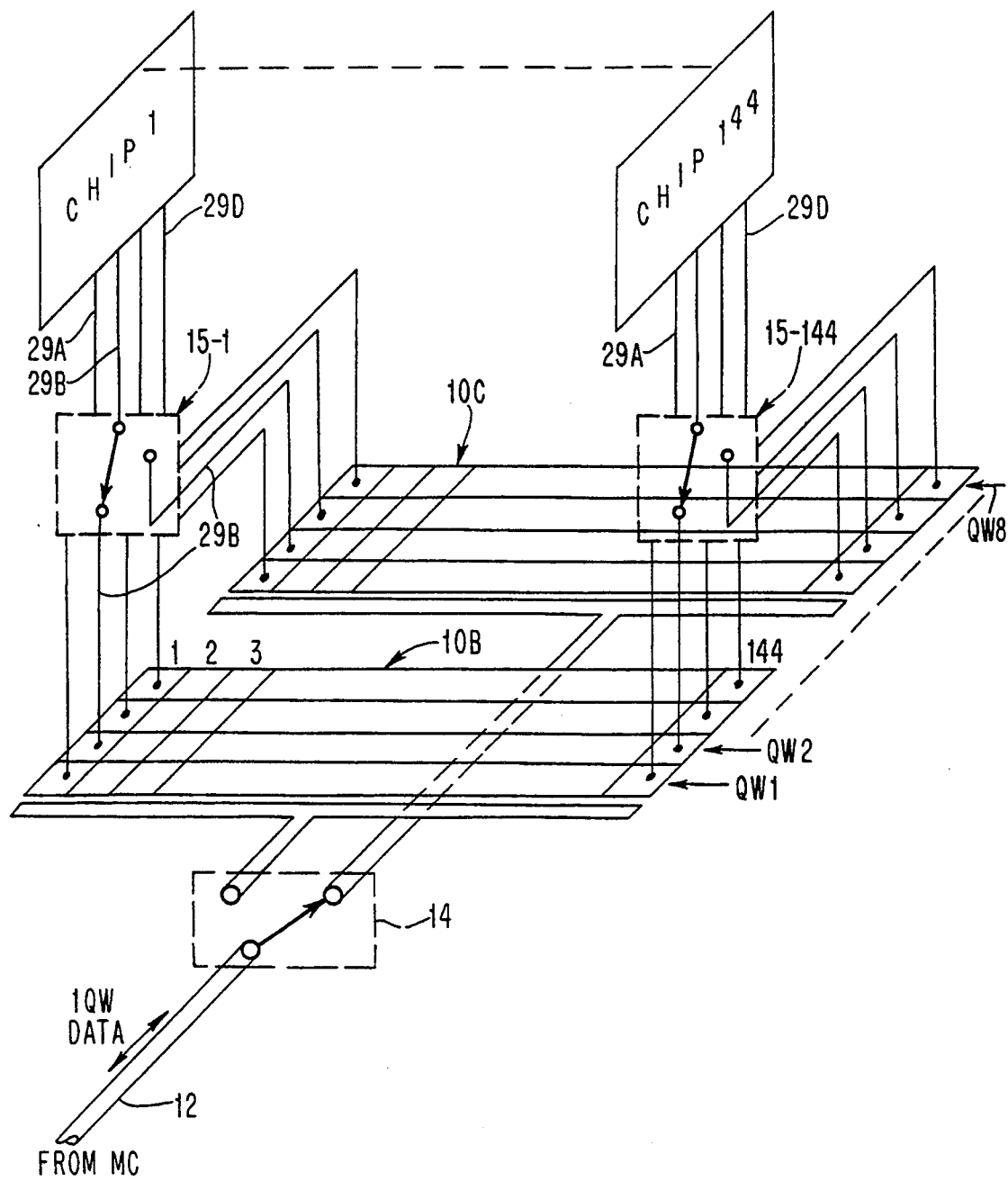
FIG. 6 illustrates special store buffering for a memory system comprised of chips using the subject invention for obtaining a zero gap between a line fetch and a following line store in the memory.

FIG. 6 shows store buffers 10B and 10C which connects to bus 12, in a manner similar to the way bus 10A in FIG. 2 connects to the same bus 12. Buffer 10B receives four consecutive QWs and then buffer 10C receives four consecutive QWs (on 4 QW boundaries), as controlled by an electronic switch (gate) 14.

For a memory line store operation responding to a processor store request, 4 machine cycles will load 4 QWs alternately into either data buffer 10B (or 10C) of FIG. 6 from bus 12 at the rate of one QW per machine cycle, and each data buffer unloads its 4 QWs in parallel in 4 machine cycles to the 144 chips, during which the other buffer 10B (or 10C) is being loaded from bus 12. The alternation between buffer 10B and 10C is done by switches 15-1 through 15-144. Hence each memory line store is done in 32 sequential machine cycles for loading 32 QWs into buffers 10B and 10C with 8 loadings to the 144 chips, in which no gap occurs between 4 QW sets within the line transfers on bus 12.

In each unloading of buffer 10B or 10C into the 144 chips for a store operation, each chip receives four data bits on lines 29A through 29D in its four SRAMs. Hence, each SRAM only stores into 8 of its 128 data bit locations in its contained subrow in the preferred embodiment for handling a 32 QW line size.

It is noted that it is easy to change the memory system line size to any number of QWs from 4 QWs to 128 QWs (in increments of 4 QWs) by merely changing the number of (C0-C6) signals for a line access, without changing the 144 chip memory system embodiment described herein except for the number of externally-supplied C0-C6 signals. This is because each (C0-C6) signal accesses one full loading (4 QWs) of any of buffer 10A, 10B or 10C corresponding to one bit in each SRAM for the 144 chips, regardless of the memory line size. Hence, one 4 QW loading of buffer 10A, 10B or 10C per memory line is the minimum number handled by one (C0-C6) signal that accesses (fetch or store) only one bit in each SRAM. And a maximum of 128 unique loadings of buffer 10A, or of buffers 10B and 10C, per memory line is the maximum number handled by 128 (C0-C6) combination signals that access all 128 bits in each SRAM (in time sequence and not necessarily in address sequence).

Address Multiplexing to Each Chip:

In the preferred embodiment, each chip of the type described in FIG. 1 has 18 I/O pins for receiving the 22 address bits used to locate one data bit in each of the four SRAMs in each of the 144 chips comprising the memory system. Of these 22 bits, R0-R14 locate a row and subrow in a DRAM and C0-C6 locate any single bit of the 128 bits in the subrow in the SRAM in each quadrant of the chip.

One chip operation (fetch or store) accesses one memory line. And one memory line involves accessing one subrow in each SRAM. One chip operation is clocked with one set of DRAM address bits R0-R14 and 8 sets of SRAM address bits C0-C6 as shown in FIG. 3 for each processor line fetch (or line store) request.

Figure 3:
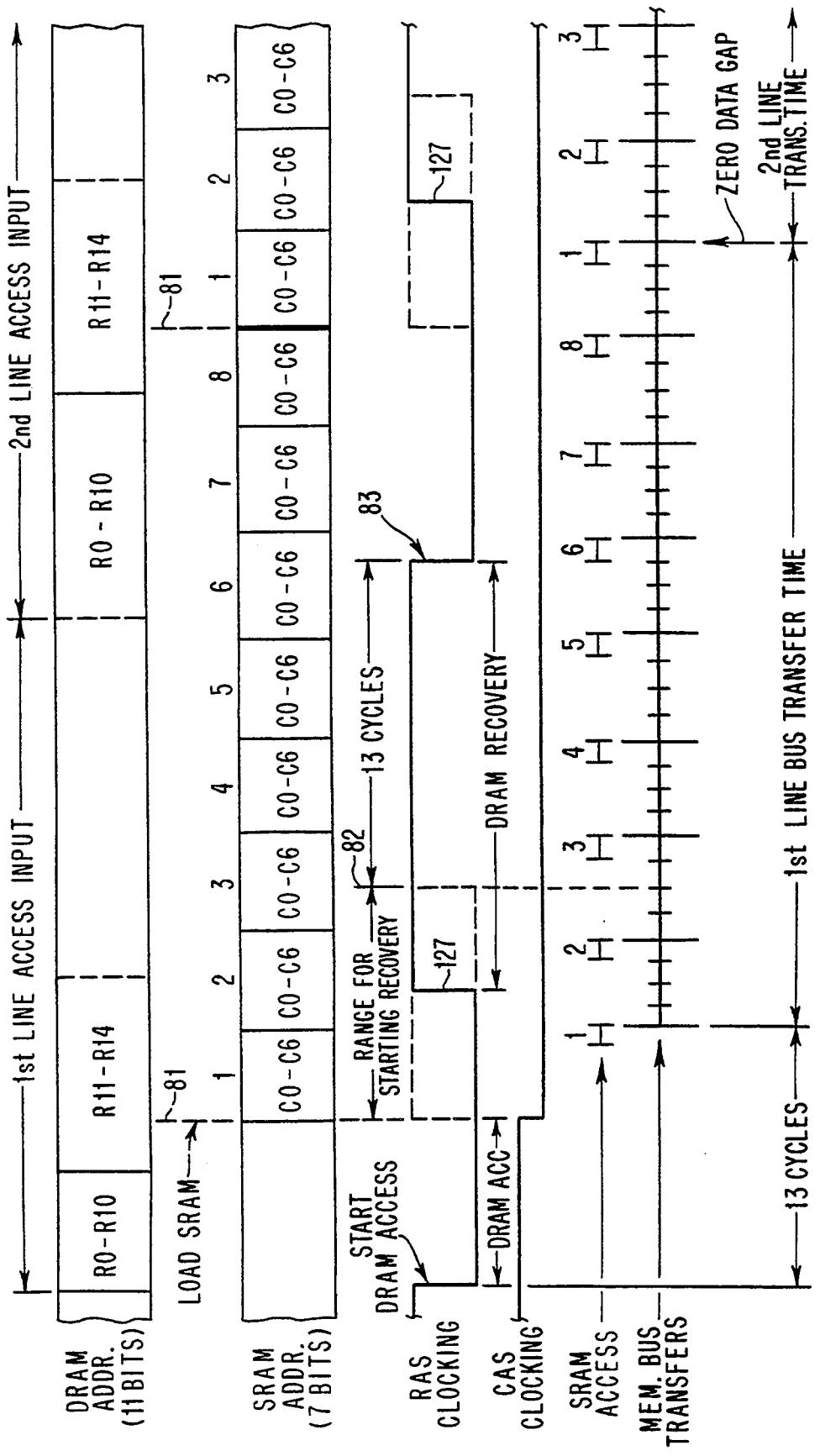
FIG. 3 illustrates waveforms of memory control signals for fetch operations by an embodiment of the invention for obtaining a zero data gap between data outputs of consecutive fetch operations.

In FIG. 3, the diagrams "RAS addressing" and "CAS addressing" show an example of how the 22 signals can be multiplexed on 18 pins comprising 11 pins that receive signals R0-R10 at one time and R11-R14 at another time; and 7 other pins receive signals C0-C6. Each set of bits (C0-C6)1 through (C0-C6)8 is provided to its 7 pins without any interference with any of the R0–R14 signals (provided to other pins). These signals are provided to the pins by the memory controller and the signals are distributed within the chip to each of its quadrants. First, bits R0–R10 are latched in address buffers 23(0)–23(10), and then bits R11–R14 are latched in subrow decoder 26 for a memory line access.

In FIG. 3, the timing of R0–R10 and R11–R14 transfer the selected sub-row into the SRAM before the first (C0–C6)1 is received. The first (C0–C6)1 selects the first SRAM bit for the first buffer load (shown at time 1 in the diagram "SRAM ACCESS"). Then the buffered 4 QWs are outputted to the memory controller during the next 4 machine cycles, as previously explained. Then at loading times 2–8, the following loadings of data buffer 10A occur and each is timed with the last part of the fourth machine cycle of the last buffer loading in which the last QW in the data buffer is outputted just before the data buffer is loaded from the 144 chips with the next 4 QWs in the line.

During two consecutive memory line fetches in FIG. 3, the time of at least the last SRAM address signal (C0–C6)8 for a memory line fetch overlaps the subrow selection time in the DRAM by address bits (R0–R6) and (R7–R10) for the next memory line fetch. This overlap enables a zero data gap in the data output between the memory line fetches when using the memory system in FIGS. 3.

A zero gap means that the data flow of one QW per machine cycle continues on bus 12 from one line fetch to the next line access without any interruption, such as shown in FIG. 3, which transfers sequential sets of 32 QWs without an intervening machine cycle not having a QW transfer on bus 12.

If the memory system in FIG. 2 uses buffer 10A as both a fetch buffer and as a store buffer, a zero data gap is obtained between consecutive memory line fetches, but a data gap of 4 machine cycles is obtained between a memory line fetch and a following memory line store.

However, the addition of the two store buffers 10B and 10C shown in FIG. 6 while using the data buffer 10A in FIG. 2 as a fetch buffer also obtains a zero data gap between a memory line fetch and a following memory line store.

Prior Chip Operation:

In order to better understand the embodiments of the subject invention, a prior art example is explained with the use of FIG. 4 of why the prior art cannot obtain any zero data gap operation on the memory system bus for consecutive line fetch operations. The same 18 pins per chip are assumed to be used for receiving the same 22 addressing bits R0–R10, R11–R14, and (C0–C6)1 through (C0–C6)8 for this prior art example.

The prior art technique represented in FIG. 4 uses the same memory access cycles for line fetches and line stores, involving having the DRAM recovery start when SRAM accessing is completed for both fetches and store. This is when the "RAS clocking" signal rises to its high level after (C0–C6)8. FIG. 4 shows address and clock timings, DRAM row and SRAM access times, and memory time for fetching a data line of 32 QWs.

The start of DRAM recover for any chip operation (fetch or store) does not occur in the prior art commercial DRAMs until the SRAM accessing was at least near its completion. The starting signal for DRAM recovery was a switching of the level of the RAS clocking signal from low to high after the end of SRAM accessing.

The next line access (fetch or store) cannot start until the next fall of the RAS clocking signal from high to low level (which did not occur until after the end of DRAM recovery for both fetches and stores in the prior art). Since DRAM recovery takes 13 machine cycles and takes place 5 cycles before the last QW was delivered and the next fetch access did not start until 13 cycles after RAS has fallen, it takes 21 machine cycles on bus 12 to transfer its first QW of the next accessed line.

Thus FIG. 4 shows a 21 machine cycle data gap (13−5+13 cycles) between consecutive line fetches of 32 QWs transmitted on the memory bus 12. That is, before the first QW output could start for the next memory line fetch, it first had to wait 8 (i.e. 13−5) cycles for DRAM recovery to complete, and it then had an additional 13 machine cycle wait before its first QW was transmitted on bus 12.

Then 53 machine cycles is total title for a fetch or store access in this prior art example, as shown, in FIG. 4. Therefore the 21 machine cycle gap causes a 40% degradation (21/53=0.396) in memory utilization for each 32 QW line transfer in this prior art example, when compared to the zero gap for line fetches obtainable with the embodiments of the subject invention.

The following assumptions are made for the timing parameters shown in FIG. 4 in terms of the number of CPU machine cycles:
Access time from DRAM-to-bus: 13 Cycles
SRAM I/O access time per bit: 4 Cycles
Data-buffer access time: 1 Cycles
DRAM recovery time: 13 Cycles Operation of the Preferred Embodiments:

FIG. 1 illustrates the path for transferring a subrow of data bits from any DRAM into its SRAM on a chip. The data bits in the subrow are then externally available from the SRAM in a chip fetch operation. As soon as a subrow is in the SRAM for a fetch operation, the preferred embodiment "disconnects" the SRAM from its DRAM and starts the DRAM recovery process. (The SRAM holds its data bits in a static manner, and it does not need recovery as does the DRAM.) Several of the SRAM bits are read one after the other, while the DRAM is performing its recovery operation within the same time period. Then the DRAM recovery overlaps the SRAM readout of one or more data bits from the chip, and the DRAM becomes ready for a next fetch or store as soon as the SRAM readout is done, which is earlier than was possible for prior conventional semiconductor memory chips containing DRAMs and SRAMs.

The overlap of DRAM recovery and the SRAM data outputting on a chip by the embodiments of this invention provides a significant reduction in the number of machine cycles that are required for a fetch access. The prior art example in FIG. 4 showed a conventional cycle time of 53 cycles per DRAM row access (which is the same for both fetches and stores). The example of the operation of the embodiments of the invention in FIG. 3 significantly reduces the fetch time to 32 cycles, which is about a 40 percent improvement, obtained by reducing the conventional data gap of 21 cycles to a zero data gap between line fetch transfers on the memory data bus. The data gap between line store (write) accesses remain at 21 machine cycles for a total of 53 cycles per line store operation. Since most memory accesses are fetches (for example 75 percent), this fetch access reduction has the effect of significantly increasing the average memory utilization for semiconductor memory chips using DRAMs with SRAMs.

Figure 5:
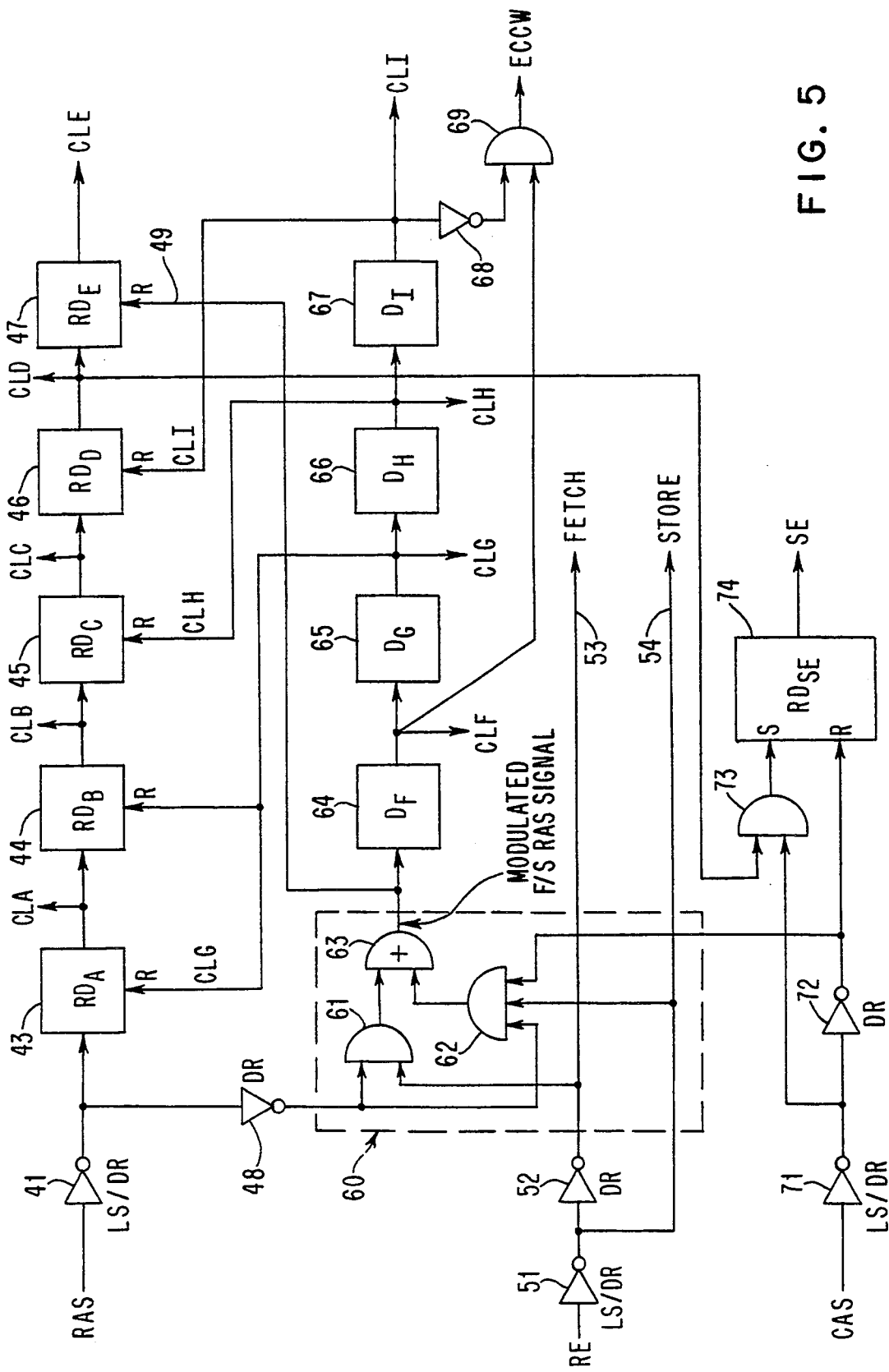
FIG. 5 represents clock generator circuits for controlling the operational timing used in each chip of the preferred embodiment of the invention.

Clocking Circuits:

FIG. 5 illustrates the clock signal generator of the preferred embodiment. The clock signal generator is located within each chip for providing clocking signals distributed within the chip to its four quadrants for controlling its fetch and store operations.

The clock generator in FIG. 5 is controlled by clock control signals RAS, CAS and RE, which are provided to I/O pins on the chip from the memory controller according to principles described in this specification. The RAS signal controls the DRAM row and subrow selection, and the DRAM recovery. The CAS signal enables the chip to receive the eight C0–C6 signals for selecting the eight data bits in a selected subrow in the SRAM for output to the data buffer 10A in FIG. 2 and input into buffers 10B and 10C in FIG. 6.

The RE signal is provided by the system for each memory request to control the required data fetch/store (read/write) operation of the chip for satisfying a memory request. The high level of the RE signal indicates a fetch operation is to be made by the chip, and the low level indicates a store operation is to be made by the chip.

Clock pulses are generated and outputted by two chains of delay circuits shown in FIG. 5. Outputs signals CLA, CLB, CLC, CLD, CLE are from the first chain, and they are used for controlling the DRAM data access. Outputs signals CLF, CLG, CLH, CLI, ECCW from the second chain are used for controlling DRAM recovery. The first chain is made of a series of RDs (resettable delay blocks) 43, 44, 45, 46 and 47, in which the output of an RD can be unconditionally reset to its low level when the block receives a reset input activated to a high level, even though its main input remains at a high level. The second chain is made of D blocks (delay circuit blocks) which do not have a reset input, each having an output equal to its input after a time delay.

FIG. 5 also includes the logic elements: LS/DR (inverter driver with level shift circuit) converts an input bipolar level into an on-chip FET level, and DR (inverter driver circuit) with an output that inverts its input signal. Conventional AND, OR, INVERT symbols are used. The circuits shown in FIG. 5 use positive logic, i.e. an AND gate output is activated when all its inputs are at their high level, and an OR circuit output is activated when any of its inputs is at high level.

The clock generator outputs signals CLA, CLB, CLC, CLD, CLE, CLF, CLG, CLH, CLI, ECCW and SE are internally distributed to each of the four quadrants on the chip as shown in FIG. 1.

The circuits in box 60 in FIG. 5 control the initiation of the DRAM recovery clock signals differently for fetch and store operations on the chip, which is a novel feature in the described embodiments. The output of box 60 is an F/S RAS signal modulated by the RE and CAS signals.

Clock Operation for DRAM/SRAM Data Accessing:

The timing of the DRAM accessing clock signals CLA, CLB, CLC, CLD and CLE is the same for both fetch and store operations on a chip. The start time of the DRAM recovery clock signals CLF, CLG, CLH, CLI and ECCW is different relative to the accessing clock signals for fetch and store operations, because DRAM recovery is initiated differently in embodiments of this invention for a fetch (read) operation than for a store (write) operation.

The fall 83 of the RAS clocking signal received by LS/DR 41 controls the start of a chip clock operation for controlling the DRAM/SRAM data accessing for a memory line request. The next rise of the RAS clocking signal controls the start of the chip clock operation for controlling DRAM recovery. And the next fall of the RAS signal indicates the end of the DRAM recovery and the start of the next clock cycle for the next memory line request.

After the DRAM has completed a recovery operation, the DRAM is in a precharged state ready for a next accessing operation. Then all dynamic circuits of FIG. 1: the address buffers 23, the DRAM decoders 22, the DRAM row drivers 22, the row and bit lines, the sense amplifiers 24, and the ECC logic 27 are all in a predetermined (or precharged) state. When they are in their precharged state, the DRAM is waiting for the RAS signal level to fall to its low level to initiate the next DRAM access sequence.

Shortly after RAS has fallen to its low level (after the delay in RDA), a CLA clock output then goes to its high level to enable the dynamic address buffers (ABs) 23(0)–23(10) to latch the R0–R10 signals for addressing a row in the DRAM 21.

The outputs of the address buffers condition the DRAM row decoders and drivers 22, so that the selected row goes to high level when the next clock signal CLB (delayed by RDB) goes high. Then, decoder 22 selects and activates a DRAM row line to interrogate a row of 2192 DRAM bit cells by altering their respective bit line voltages according to the information stored in the memory cells. Small signals are developed on the bit lines and presented to respective sense amplifiers 24 which are clocked by CLC from RDC. The amplified signals of the selected row of data and check bits from the sense amplifiers 24 are presented to subrow decoder 26, which latches the R11–R14 signals to address a subrow of 137 data and check bits using the CLD clock signal from RDD and provides the subrow to ECC logic 27.

The ECC logic 26 corrects any bit(s) in error, eliminates check bits, and outputs 128 bits of corrected data that are gated to SRAM 28 by the CLE clock signal from RDE. SRAM 28 must be enabled by clock signal SE (SRAM Enabled) before the corrected subrow can be written into, or data bits read from, SRAM 28. The SE signal is outputted from FIG. 5 when the CAS signal is in its low level and the CLD clock signal is high. Any bit location in the subrow in SRAM 28 can be read from, or written into, while being addressed by a data bit selection signal C0–C6 applied to the SRAM decoder.

SRAM Access Timing:

The first signal C0–C6 accesses one data bit in the SRAM in each of the four quadrants of the chip immediately after time 81 in FIG. 3. And shortly thereafter, the four SRAM data bits per chip are loaded into the data buffer 10A in a single machine cycle shown at "SRAM LOADS BUF" time 1 in the first "Memory Buffer Load Time" of FIG. 3. In the next consecutive four cycles, a QW is outputted on the quadword bus, and near the end of the fourth cycle the next buffer load occurs to continue the data readout operation.

Then the second through eighth signals C0–C6 each access four data bits in the four quadrants of the SRAM and load data buffer 10A in single machine cycle. And in the next consecutive four cycles, a QW is outputted on the quadword bus, and near the end of the fourth cycle the next buffer load occurs to continue the data readout operation, until 32 QWs have been readout after 8 loadings of the data buffers by the SRAMs.

DRAM Recovery Sequence for a Fetch Operation:

For a fetch operation, DRAM recovery is started by AND gate 61 in circuits 60 when the SRAM is loaded. DRAM recovery overlaps the I/O data bit accessing in the SRAM. Unlike for a store operation, DRAM recovery for a fetch is initiated long before the end of data accessing in the SRAM, so that DRAM recovery is over at or before the end of SRAM accessing.

With the embodiments of this invention for a fetch (read) operation, each of the four DRAMs in a chip does recovery while its SRAM remains active, because the content of SRAM is not changed during a fetch operation. AND circuit 61 in FIG. 5 starts the clock recovery signals for each fetch request. The DRAM recovery requires 13 machine cycles in FIG. 3. Recovery can start anywhere in a time-range from time 81 up to time 82, with the latest time 82 determined so that 13 cycles later (time 83) the next RAS cycle can start (fall of RAS) early enough for the first QW of data for the next memory line access to be transferred on bus 12 on the next machine cycle after the last QW of the current line fetch in order to have a zero data gap between the line accesses.

In FIGS. 3 and 5 the start of the recovery cycle is signalled by the rise 127 (shown in FIGS. 3 and 4) of the RAS signal (i.e. the double inverted output of DR 48 rises to high level when RAS rises at the input of LS/DR 41). Then AND gate 61 and OR circuit 63 pass the RAS signal to DF 63 when RAS rises to its high level. The AND circuits 61 and 62 ensure that the CLF clock signal, the first clock in the recovery chain, will go to the high level in read mode (RE=1) once RAS signal has gone to high level. The clock generator must guarantee that the RAS signal to AND gate 61 will not go to high level before the CLE clock signal has gone to the high level, to assure that recovery does not start until after the SRAM is loaded. If the RAS goes high first at the output of AND gate 61, it signals the reset input of RDE to prevent the CLE signal from going high afterwards, and this terminates the CLE clock signal to disable the ECC operation of circuits 27 (shown in FIG. 1). Gate 61 does not have any CAS signal input, so that RAS can rise to its high level in read mode before CAS rises, which happens in the operation of the preferred embodiment since CAS is in its low level during SRAM input/output bit accessing.

Thus, a fetch signal (RE=1) causes the clock generator to operate differently from a store signal (RE=0). For a store operation, AND gate 62 prevents the DRAM recovery from starting until the RAS and CAS signals have both gone to high levels; that is, until RAS indicates it is ready for DRAM recovery and CAS indicates the SRAM is not accessing data.

Output signal CLF enables an AND gate 69 to provide output signal ECCW. The other input of AND circuit 69 is enabled (at the beginning of the DRAM recovery process) by inverter 68 not receiving any clock signal CLI (provided at the end of the DRAM recovery process). Signal ECCW gates the content of the 128 SRAM data bits through the ECC logic in FIG. 1 and adds the 9 check bits to provide a 137 bit subrow for overlaying the corresponding subrow in the sense amplifiers 24. This ECC operation does not change any data bit in the subrow for a fetch, unless error correction was done on an erroneous DRAM data bit in the subrow by the ECC circuits when they transferred the 128 data bits into the SRAM.

The input signal to DF 64 not only initiates the DRAM recovery clocking process, but also is provided on lead 49 to the reset input of RDE 47 which previously provided its clocking signal CLE to control the ECC operation in the transfer of the subrow data to the SRAM. This reset of RDE 47 assures the termination of the previous clock signal CLE that controlled the previous SRAM-direction enablement of the ECC circuits, so that the ECC circuits are in a condition for use in the reverse direction to the DRAM by the ECCW clock signal from AND gate 69 which operates the ECC circuits to transfer the SRAM data plus new ECC bits back to the DRAM.

Then delay circuit DH 66 receives the delayed RAS signal and outputs signal CLH that gates the row from the sense amplifiers to the DRAM row currently activated by the address buffers 23. Finally, delay circuit DI 67 is activated to do the final resetting and precharging of bit lines needed for each quadrant to complete the recovery. The four quadrants are ready the next following fetch or store operation.

DRAM Recovery Sequence for Write Operation:

The preferred embodiment uses the characteristic of the CAS signal of switching to high level only after all updating of the SRAM content has ended. AND gate 62 in circuits 60 senses the state of the CAS signal during a store operation, since it also receives the inverted RE signal from LS/DR 51. RE=0 (low level) indicates the WRITE state, which when inverted provides the high state to gate 62.

Then the first recovery clock signals CLF, CLG, CLH and CLI operate in the same manner as described for the fetch operation, except that these signals have been delayed by the operation of AND gate 62 until the SRAM accessing is completed, so that no significant overlap is possible in write mode for the DRAM recovery and SRAM accessing.

Gap Effect of Different Types of Requests:

In FIGS. 3 and 4, the "line transfer time" is the time for 32 machine cycles to readout 32 consecutive QWs on bus 12 in eight sets of 4 QWs sequentially loaded into data buffer 10A from the 144 chips in response to the sequence of eight C0–C6 signals to SRAM 28. With the embodiments of this invention, the first QW for the next line transfer on bus 12 can start on the very next machine cycle after the last QW machine cycle for a prior line fetch without having any data gap, i.e. without any intervening machine cycle not having a QW data transfer on bus 12, which is a zero gap.

In the preferred embodiment for each fetch operation, the rise of the RAS clocking signal (following the RAS fall that starts a chip fetch operation) is done early enough to cause the entire DRAM recovery to overlap the SRAM data readout of 32 QWs on the memory system bus. Thus when the SRAM readout is completed, the DRAM recovery has also completed, so that the next memory line fetch can have its R0–R10 signals and the first part of its R11–R14 signals overlap the later part of the SRAM readout, e.g. (C0–C6)6 through (C0–C6)8 of FIG. 3, for the last memory line fetch by having these signals received by different pins on the chip. Then, the first QW for a next following line fetch can start on the very next machine cycle after the last QW machine cycle for the prior line fetch without having any data gap, which is a zero gap.

Similarly, the "line store transfer time" (for transferring 32 consecutive QWs on bus 12 into data buffers 10B and 10C in 32 machine cycles for a data line transfer) involves 32 sequential QW transfers from the bus into the buffer pair 10B and 10C. Buffers 10B and 10C are used alternately to receive 4 QW sets of data in a gapless manner between the QW sets within a line transfer on bus 12 for a memory store. After any 4 QW set has been loaded into buffer 10B or 10C, it takes 4 machine cycles for each of the SRAMs addressed at a C0-C6 location to receive a respective data bit of the 4 QW set. During these 4 cycles, data bus 12 can be transferring a next set of 4 QWs into the other buffer 10B or 10C to overlap the time the SRAMs are receiving each of the data bits from the other buffer of the pair 10B an 10C for the last received 4 QW set.

Then, the first 4 QWs for a line store (following a line fetch) can be received by data buffer 10B or 10C from bus 12, while the last QW of the last set of 4 QWs for the prior line fetch are being outputted to bus 12 from the buffer 10A in FIG. 2. Then, as soon as the last QW is received by the MC from bus 12 for a line fetch, the next machine cycle can transfer the first of the next 4 QW set into data buffer 10B or 10C. When the buffer 10B or 10C is filled, the 144 chips do the line store operation.

But even with the embodiment having three data buffers, a data gap (e.g. 21 machine cycles) cannot be avoided between consecutive line store operations on bus 12, because of the intervening DRAM recovery, as occurred in the prior art.

DRAM/SRAM Overlap Summary:

Accordingly, the embodiments of this invention overlap the DRAM recovery operations with the SRAM readout operations for a fetch operation in a chip. By doing this, the embodiments of the invention can decrease the gap degradation to zero for fetch accesses. To do this, the embodiments of the invention start the DRAM recovery at any time after the SRAM is loaded during a fetch operation (instead of after the SRAM accessing is completed, as is done for fetch operations in the prior art).

The effect of the DRAM/SRAM overlap is to shorten the preferred embodiment's memory system line fetch time by 21 cycles compared to the prior art example given herein. That is, the first QW transfer on bus 12 for a next memory line fetch can be done in the machine cycle after the last QW transfer on bus 12 for the prior line fetch when using the store data buffering in FIG. 6 and the fetch data buffering in FIG. 2 for the same set of 144 chips and the same bus 12. In this example, the memory utilization time for a fetch is reduced from 53 machine cycles (53=32+21) to 32 machine cycles, a 40% reduction.

Write Operation Constraint Summary:

This DRAM/SRAM overlap done for line fetch operations by the embodiment is not feasible for a line store operation following another line store operation. This is because the SRAM content may be changed during any or all of the SRAM accessing in any line store operation, but the SRAM cannot be changed during a line fetch operation. The DRAM recovery for a line store operation cannot start until all data changes in the SRAM content are done. Accordingly, all bits from data buffer 10B or 10C must be first written into the SRAM content, and then (and only then) can DRAM recovery start which includes storing the entire SRAM content, as modified, into the currently addressed DRAM row. Hence, significant DRAM/SRAM overlap is not feasible in a line store operation, which causes a data gap to follow each line store transfer on bus 12.

Line Fetch Time Not Effected by Fetch and Store Sequencing:

The shortened operation time for fetches obtained by the embodiments of this invention occurs whether or not the following line access is a fetch or store, because the store's gap penalty occurs at the end of the store (and not at the beginning of a store). The fetch overlap of DRAM recovery and the SRAM outputting are not affected by other memory line accesses. Likewise the lack of overlap during a store operation (that prevents significant time shortening for a store operation) is also restricted to the store operation itself. Hence, neither a fetch nor a store operation need affect the memory utilization time of the other in the embodiments of this invention.

The gap between consecutive line fetches is not affected by the manner of data buffering by the memory system, such as whether there is one, two or three buffers 10A. However, the gap between a line fetch and a following line store is affected by the number of buffers 10 and by having more than one bus 12.

Unequal Time for Fetch and Store Operations:

For a computer memory system to use the invention, the system memory access time for a fetch operation must be made correspondingly shorter than the system memory access time for a store operation. (Prior art computer memory systems used the same access time for both fetch and store operations.)

Thus, a memory controller used with the embodiments of this invention needs to control its RAS clock time differently for fetch and store operations. Prior memory controllers used the same RAS clock time for both a fetch and a store operation.

RAS Fetch/Store Generation Controls in Memory Controller:

The RAS signal in the preferred embodiment is generated in the memory controller (MC), from which the RAS signal is sent to the memory chips to control their fetch, store and recovery operations. The RAS signal generator generates a different RAS waveform than the RAS in the prior art. The embodiments of the invention provides different RAS waveforms for fetches and stores (i.e. called F/S RAS herein). Each F/S RAS cycle has two parts, a RAS active part and a RAS recovery part. The RAS active part has one of two different time lengths, one for a fetch request and another for a store request. The RAS generator selects the correct one of the two different time lengths for the active part, which is immediately followed by the RAS recovery part. The term RAS means F/S RAS herein, unless RAS is referring to the prior art in which case a periodic RAS waveform is meant (same for fetch and store).

The F/S RAS cycle starts when the RAS signal falls from its high to low level, which also starts the active part of the cycle. The active part ends when the F/S RAS signal switches from its low to high level, which also starts the recovery part of the F/S RAS cycle. The actual DRAM recovery takes place within a minimum time allowed for the recovery part, after which the RAS generator signals for the next memory request to start the generation of the next F/S RAS cycle. The high level of the recovery part of the F/S RAS cycle can last longer than the minimum recovery time and lasts until the next memory request is sent to the RAS generator.

The start of a F/S RAS cycle also triggers the start of a CAS cycle and the capturing of the current RE signal state. The CAS active state starts after a short delay to allow time for the R0–R14 address bits (which may be multiplexed) to reach the chips before the CAS signal.

As long as the next request is immediately available to the RAS generator, a minimum time F/S RAS cycle is generated for each fetch request.

Figure 8:
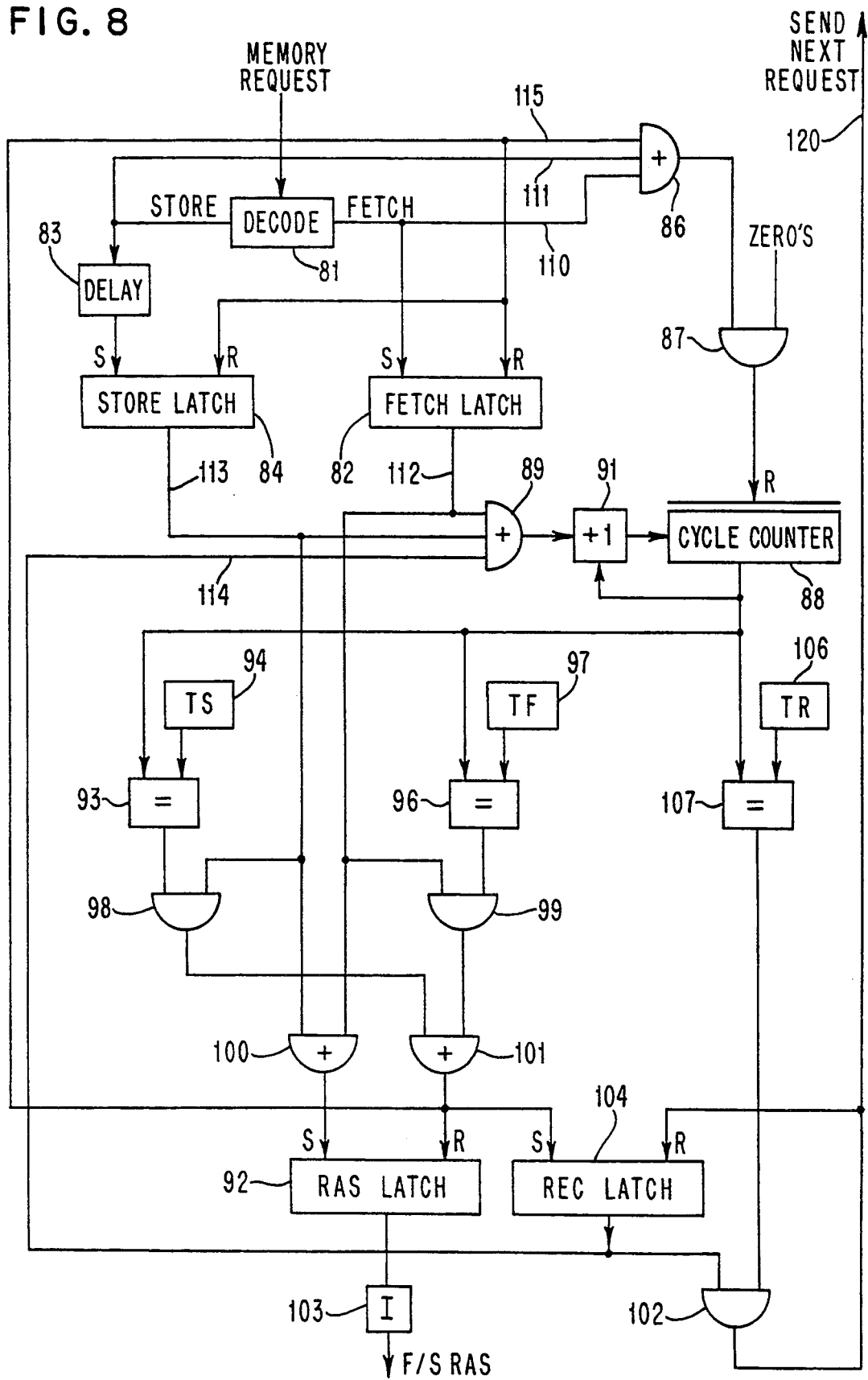
FIG. 8 illustrates a RAS generator used in the preferred embodiment.

FIG. 8 shows RAS generation means used by the preferred embodiment. Decoder 81 detects each memory access request received by the MC to determine if it is a fetch or store request (command). When a fetch request is detected, an output of the decoder 81 sets a fetch request latch 82. When a store request is detected, an output of the decoder 81 is delayed by delay means 83 before setting a store request latch 84; the delay means 83 waits until the data to be stored arrives at the 10B or 10C in FIG. 6 before setting the store request latch 84. The store delay value in delay circuit 83 is set therein by programmed means.

When in set state, the output of either fetch latch 82 or store latch 84 is at its high level, which controls a cycle counter 88 to time the active part of the F/S RAS cycle.

Set and reset inputs of a RAS latch 92 control the active part of the outputted F/S RAS waveform. The active RAS part is started when either the fetch or store request latch 82 or 84 is set, which provide its respective output through an OR circuit 89 to set the RAS latch 92, which then outputs its high level. An inverter 103 inverts the RAS latch output signal, so that the low level provides the outputted F/S RAS active part.

The active part of the RAS cycle from inverter 103 ends for a fetch or store request when the RAS latch 92 is reset to cause its output to drop to low level, which causes the F/S RAS output from inverter 103 to rise to high level. The end of the RAS active part is also the start of the recovery part of the F/S RAS cycle.

The RAS active part is determined by cycle counter 88 which measures time in machine cycles differently for fetch and store requests. Counter 88 has its content reset to zero when each memory access request is received by decoder 81 through line 110 or 111. This is done by each request being provided from the decoder output through an OR circuit 86 to activate an AND gate 87 to pass an all-zero reset value to the counter 88. After being reset, the counter 88 is incremented by one for each following machine cycle while a machine cycle incrementer 91 is enabled by an OR circuit 89 via lines 112 or 113 to provide to counter 88 an increment-by-one signal per machine cycle.

The time in machine cycles for the RAS active part is determined by values set in a fetch time register (TF) 97 and a store time register (TS) 94. The values are set therein by a programmed source (not shown). Likewise, the time in machine cycles for the RAS recovery part is determined by the value set in a recovery time register (TR) 106 which also has its value set therein from the programmed source.

The control over the active and recovery parts of the F/S RAS waveform is obtained by using comparators 93, 96 and 107. All comparators are active at the same time, but only one of these comparators is outputted due to only one of latches 82, 84 or 104 being in set state at a time. Each compares the received one of the time values TF, TS or TR to the current cycle time being outputted from counter 88 and indicates when the number of cycles in counter 88 reaches the cycle value in the connected value register 97, 94 or 106.

Thus, a fetch request received by decoder 81 resets cycle counter 88 to zero via OR circuit 86 and AND gate 87, and sets fetch latch 82 to activate cycle counter 88 which starts counting cycles from zero. The fetch request signal from decoder 81 also sets RAS latch 92 through OR circuit 89 to start a F/S RAS cycle by having the RAS signal fall to its low level at the output of inverter 103. Although all of the comparators start comparing the outputted counter value to their respective TS, TF and TR values, only the output of comparator 96 is used for a fetch request because only its output gate 99 is enabled by the fetch latch set state. Hence when the counter reaches the TF value, an output of comparator 96 is provided through AND gate 99 and an OR circuit 101 to reset the RAS latch 92 and end the fetch active part of the RAS cycle and start the recovery part. Then the low output of the RAS latch inverter 103 is switched from its low level to its high level by the reset of RAS latch 92 at the end of the predetermined fetch active value TF.

A similar operation occurs for a store request, in which the store latch 84 controls the RAS generator operation instead of the fetch latch 82. When store latch 84 is set, the RAS latch is likewise set and the cycle counter 88 (which has been reset) starts counting machine cycles (via line 113). And when comparator 93 compares equal on the counter output reaching the TS value in register 94, an output is provided through AND gate 98 to reset the RAS latch 92 and end the store active part of the RAS cycle from the RAS latch inverter 103, which then switches its output signal to high level to start the recovery part of the RAS waveform.

When RAS latch 92 is reset by the output of OR circuit 101 at the end of any RAS active part for either a fetch or store request, the RAS latch reset signal on line 115 passes through OR circuit 86 to activate AND 87 to reset counter 88 and start a new count operation, which in this case is the recovery count operation for controlling the recovery part of the RAS cycle. The RAS generator's time control operation for the recovery part operates similarly to the time control operation for the active part.

A recovery latch 104 is set by the same signal from OR circuit 101 that resets the RAS latch to end the active part of the F/S RAS cycle. The activated output of recovery latch 104 on line 114 passes through OR circuit 89 to start a new counting operation by cycle counter 88. Comparator 107 determines an equal condition when it reaches a count equal to the value in its TR register 106, and it outputs a compare-equal signal which passes through AND gate 102, which is now being enabled by the output of the recovery latch 104, to output line 120 which requests the MC to send the next memory request to decoder 81 for providing the next RAS cycle of operation by the RAS generator. The signal on line 120 is transmitted to request queuing control circuits in the MC to request the next memory access request be provided to the RAS generator.

Thus, the high level of the outputted RAS signal from inverter 103 remains until the next request is provided to the decoder 81 to start the next F/S RAS cycle of operation in the RAS generator. The high level of the F/S RAS waveform (started by the last recovery part) may not change until the next request is received by decoder 81 to set either the fetch or store latch 82 or 84 and therefore set the RAS latch 92 to cause the RAS signal from inverter 103 to fall and start the next RAS cycle.

The recovery time TR assures a minimum time for the recovery part of the RAS cycle, so that the DRAM recovery operation by the chips can successfully complete before the next memory request starts the next RAS cycle of operation by the RAS generator. Thus, AND gate 102 is not activated after the rise in the F/S RAS output for the number of cycles set into its TR register to prevent the output signal from being outputted on line 120 until after the expiration of the TR time, and the recovery latch is reset by the output signal on line 120 in preparation for the next cycle.

Storing a Fraction of a Data Line:

Some computer systems are designed to store a fraction of a data line with some memory commands and to store a full data line with other memory commands. In such case, it is necessary to provide a capability for storing less than a full data line with one RAS and CAS cycle, and it is desirable to correspondingly shorten the time of these cycles to speed up their accessing.

In FIGS. 2 and 6, a 32 QW data line has been assumed, which is divided into eight 4 QW sets, in which one set of 4 QWs is stored in the memory system per bit stored in each SRAM in the 144 chips of the memory system. Therefore, it is easy to divide a line into fractions of ⅛ths of a data line (each having 4 QWs) by merely controlling the number of 4 QW loadings of buffers 10B and/or 10C per fraction of a data line stored by a given command.

For example, if half a data line (16 QWs) is to be stored, then four sets of 4 QWs are respectively loaded and stored per line. To store four sets of 4 QWs requires four C0–C6 address bit permutations, i.e. (C0–C6)1 through (C0–C6)4. And the length of the active part of the RAS timing control signal should be shortened accordingly in the RAS generator of FIG. 8 to take advantage of the fractional line store for shortening the store active time. This requires the addition of another store latch, comparator and comparator output AND gate per store fraction to be handled by the circuits in FIG. 8.

The length of the CAS timing control signal for each fraction of a line should also be changed correspondingly.

Fetches may also use fractional lines, and the same shortening of the RAS (and CAS) cycles may done for them. But the system will still be operative if the lengths of RAS (and CAS) cycles are not change for fractional line stores or fractional line fetches. However, shortening the respective RAS (and CAS) cycles is needed to speed up the system memory operations, particularly if a high frequency of use exists for fractional lines.

Furthermore, the chips may have an 4 additional pins for receiving control signals from the MC for disabling the storing capability of the respective SRAMs. Then, only one, two or three of the SRAMs in every chip in the memory system may be respectively enabled for storing in parallel one, two or three QWs from buffer 10B or 10C, instead of always storing a set of 4 QWs in parallel from buffer 10B or 10C in all four SRAMs in the 144 chips.

Another Embodiment:

The preferred embodiments of the invention provide the clock circuits 60 within each chip to control the initiation of the DRAM recovery for fetches and stores. The locating of clock control circuits within a chip in close proximity to the circuits to be controlled obtains a precision in the control operation that is difficult to obtain from circuits located external of the chip.

Figure 7:
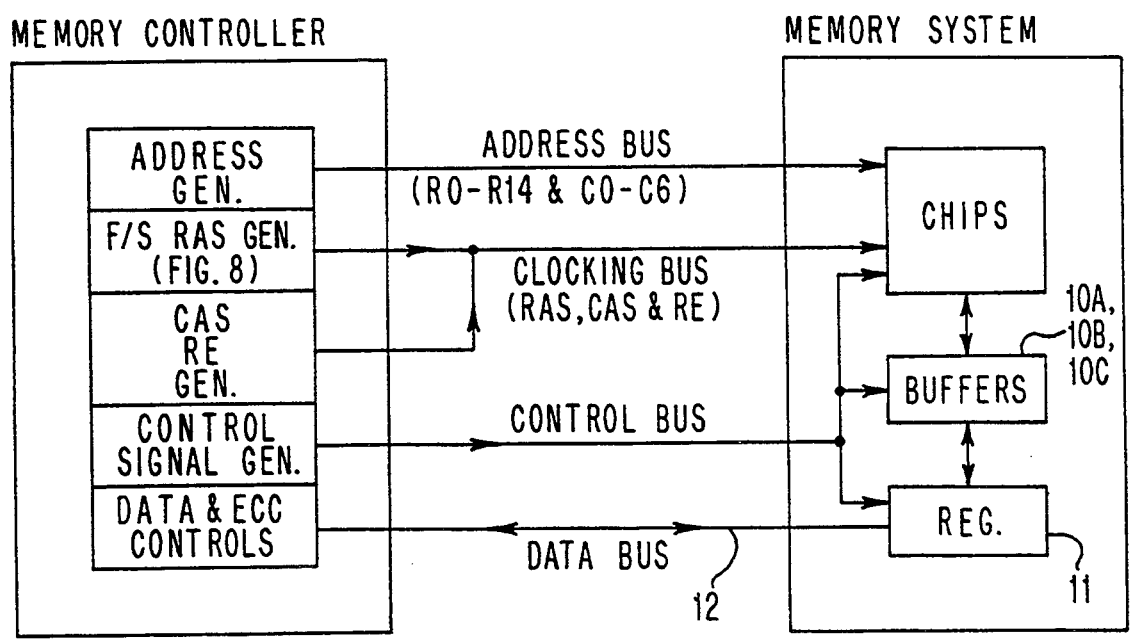
FIG. 7 illustrates connections between a memory system and a memory controller (MC) and components in the MC used by the described embodiments.

However these embodiments of the subject invention also allow the clocking initiation controls to be completely located external of the memory chips, such as by locating them in the memory controller (MC) in FIG. 7. This may be done by locating and connecting the RAS input of circuits (identical to box 60 in FIG. 5) at the F/S RAS output of the RAS generator in FIG. 8.

Circuit 60 (whether in the MC or on the chip) generates a modulated RAS signal, which is modulated by the RE and CAS signals. The distinction between the on-chip circuit 60 and the M.C located circuit 60 is in the form of the wave transmitted on the control bus from the MC to the chips. In the previously described embodiments, the F/S RAS signal is transmitted to the RAS pin on each chip. But when circuit 60 is in the MC, a modulated F/S RAS signal is transmitted to the RAS pins on the chips. The modulated waveform can change from one cycle to the next as a function of a change in the states of the RE and CAS signals.

Thus, the externally modulated F/S RAS signal will obtain overlap between DRAM recovery and SRAM data fetching the same as the on-chip modulated RAS signal previously described herein, although the internally generated waveform may be more precisely timed and therefore be the preferred manner of generation of the modulated RAS signal.

An important factor in the feasibility of using an externally-modulated RAS signal is that the chips receiving such signal must not contain an on-chip interlock (found in many DRAM memory chips used in commerce at the time of filing this specification) which prohibits the start of any DRAM recovery operation during the CAS signal's active state for either a fetch or a store operation. Thus this conventional interlock forces DRAM recovery to be delayed in all situations (fetch as well as store) until all cache (SRAM) data fetching or storing has ended. This conventional interlock cannot exist in any memory chip built according to the any embodiment of this invention.

Having thus described our invention, what we claim as new and desire to secure by Letters Patent is:

1. A method of controlling recovery in a semiconductor chip containing at least one dynamic random access memory (DRAM) and an associated static random access memory (SRAM) cache, comprising the steps of:

generating a row address strobe (RAS) sequence and a recovery clock sequence from a clock generator, transferring data to the cache from a data subset in the DRAM under control of the RAS sequence, and initiating the recovery clock sequence upon the initiation of the RAS sequence for a fetch request.

2. A method of controlling recovery as defined in claim 1, further comprising the steps of:

inputting to the chip a RAS address timing control signal, a cache address timing control signal and a fetch/store state signal, initiating the recovery clock sequence when an AND gate receives: a fetch state of the fetch/store state signal and a no RAS addressing state for the RAS address timing control signal.

3. A method of controlling recovery as defined in claim 2, further comprising the step of:

initiating the recovery clock sequence when another AND gate receives: a store state of the fetch/store state signal, a no cache address state indication for the cache address timing control signal, and a no RAS addressing state for the RAS address timing control signal, and performing a fetch operation in the chip in a shorter time than performing a store operation in the chip.

4. A method of controlling recovery in a semiconductor chip containing at least one dynamic random access memory (DRAM) having a small cache, comprising the steps of:

transferring data to the cache in response to a memory fetch request received by the chip, performing a fetching of data from the cache for the memory fetch request while performing a DRAM recovering operation in the at least one DRAM by applying a recovery clock sequence to the at least one DRAM in preparation for a next DRAM access operation.

5. A method of controlling recovery in a semiconductor chip as defined in claim 4, further comprising the step of:

allowing a next access operation to immediately be performed in the at least one DRAM as soon as the recovering operation is completed for a fetch request to the at least one DRAM.

6. A method of controlling recovery in a semiconductor chip as defined in claim 4, further comprising the step of:

structuring the chip to contain a plurality of DRAMs in which each DRAM has an associated cache structured with static random access memory (SRAM) circuits, and all DRAMs simultaneously receive each access request provided to the chip.

7. A method of controlling recovery in a semiconductor chip as defined in claim 6, further comprising the step of:

providing an error correction circuit (ECC) between each DRAM and its associated SRAM circuits to insure error-free data is fetched from the associated SRAM circuits.

8. A method for shortening a time for a data fetching operation in relation to a time for a data storing operation in a computer memory system, the memory system having a plurality of semiconductor chips, each chip containing at least one dynamic random access memory (DRAM) and an associated cache, said method comprising the steps of:

transferring data between at least one DRAM and an associated cache on an accessed chip, overlapping a fetching of data from the associated cache on the accessed chip with DRAM recovery from the fetching of the data from the DRAM, storing the data in the associated cache, and performing recovery of DRAM circuits associated with the DRAM after the storing in the associated cache is completed to obtain a shorter time for outputting data from the chip than for storing new data in the chip.

9. A method for reducing fetch time for a dynamic random access memory (DRAM) semiconductor chip, comprising the steps of:

addressing any row in a DRAM for fetching data represented by data bits in the row, fetching data bits from an addressed row to sense amplifiers in the chip, transferring at least a portion of data in the addressed row into a static random access memory (SRAM) cache within the chip, and refreshing the data bits in the addressed row by writing the data bits from the sense amplifiers back into the addressed row, recovering the DRAM by resetting DRAM circuits on the chip to predetermined states in order to prepare the DRAM for a next access, and fetching and transmitting any data bit in the cache to a means external to the chip while performing the recovering step concurrently.

10. A method for reducing fetch time for a dynamic random access memory (DRAM) semiconductor chip as defined in claim 9, further comprising the steps of:

completing the addressing step after the refreshing step is completed, and initiating the recovering step after the addressing step is completed to enable the recovering step to overlap the fetching and transmitting step.

11. A method for reducing fetch time for a dynamic random access memory (DRAM) semiconductor chip as defined in claim 10, further comprising the step of:

generating a sequence of clock pulses on the chip in response to a fetch request signal from means external to the DRAM for controlling the fetching and recovering steps.

12. A method for reducing fetch time for a dynamic random access memory (DRAM) semiconductor chip as defined in claim 9, further comprising the steps of:

storing in the cache any data bit transmitted from a means external to the chip to perform a DRAM store operation, and starting the recovering step after writing into an addressed row in the DRAM any data newly stored in the cache during the storing step, resulting in a fetch operation in the chip occurring in less time than a store operation in the chip.

13. A method for reducing fetch time as defined in claim 12 for a dynamic random access memory (DRAM) semiconductor chip containing identical plural DRAMs, further comprising the step of:

simultaneously performing each of the previous steps in the plural DRAMs, in which each DRAM has an associated SRAM cache.

* * * * *